United States Patent
Baca et al.

(10) Patent No.: US 6,248,992 B1
(45) Date of Patent: Jun. 19, 2001

(54) HIGH GAIN PHOTOCONDUCTIVE SEMICONDUCTOR SWITCH HAVING TAILORED DOPING PROFILE ZONES

(75) Inventors: Albert G. Baca; Guillermo M. Loubriel; Alan Mar; Fred J Zutavern; Harold P. Hjalmarson; Andrew A. Allerman, all of Albuquerque; Thomas E. Zipperian; Martin W. O'Malley, both of Edgewood; Wesley D. Helgeson, Albuquerque; Gary J. Denison, Sandia Park; Darwin J. Brown, Albuquerque; Charles T. Sullivan, Albuquerque; Hong Q. Hou, Albuquerque, all of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/336,340

(22) Filed: Jun. 18, 1999

(51) Int. Cl.$^7$ .................................................. H01J 40/14
(52) U.S. Cl. ...................................... 250/214 LS; 257/444
(58) Field of Search .......................... 250/214 LS, 214.1, 250/214 R, 208.1, 370.14, 370.08, 370.01, 372, 338.4; 257/440–449, 430, 431, 428, 336

(56) References Cited

U.S. PATENT DOCUMENTS 5,567,971 * 10/1996 Jackson et al. ...................... 257/431

* cited by examiner

Primary Examiner—Que T. Le
(74) Attorney, Agent, or Firm—Gregory A. Cone

(57) ABSTRACT

A photoconductive semiconductor switch with tailored doping profile zones beneath and extending laterally from the electrical contacts to the device. The zones are of sufficient depth and lateral extent to isolate the contacts from damage caused by the high current filaments that are created in the device when it is turned on. The zones may be formed by etching depressions into the substrate, then conducting epitaxial regrowth in the depressions with material of the desired doping profile. They may be formed by surface epitaxy. They may also be formed by deep diffusion processes. The zones act to reduce the energy density at the contacts by suppressing collective impact ionization and formation of filaments near the contact and by reducing current intensity at the contact through enhanced current spreading within the zones.

16 Claims, 7 Drawing Sheets

Schematic representation of a lateral PCSS

High Gain Photoconductive Semiconductor Switch
(PCSS)– Lateral geometry

Vertical geometry for PCSS

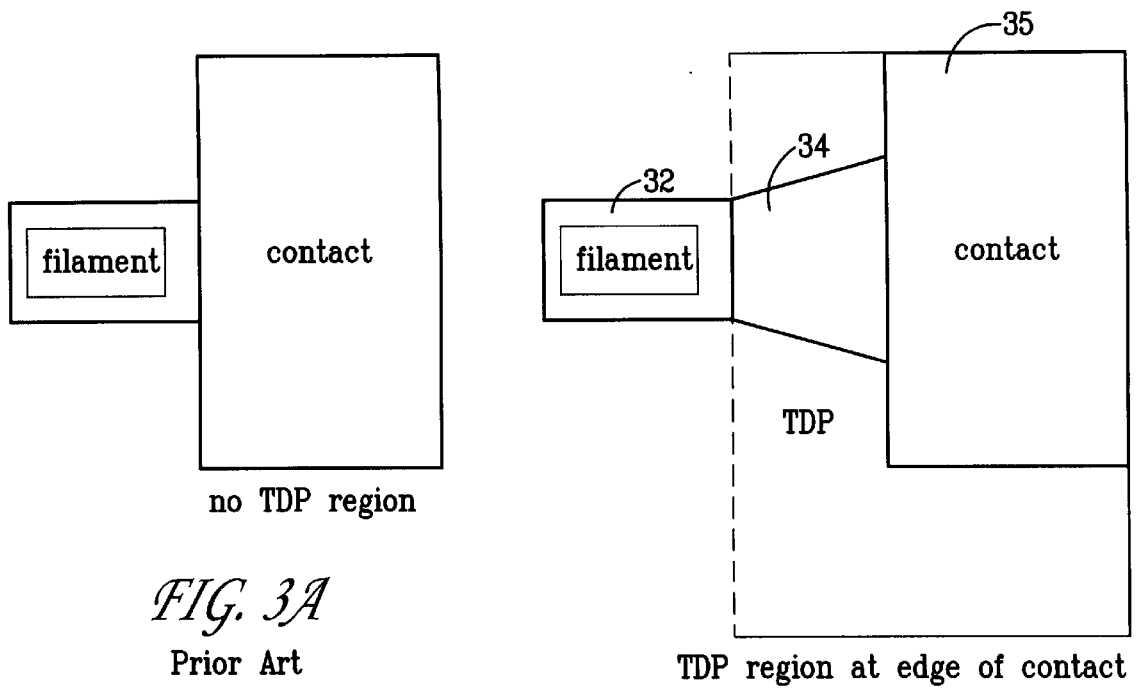
FIG. 3A
Prior Art
no TDP region
FIG. 3B
TDP region at edge of contact
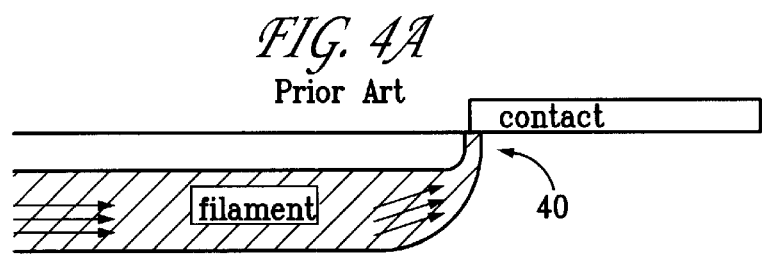
FIG. 4A
Prior Art
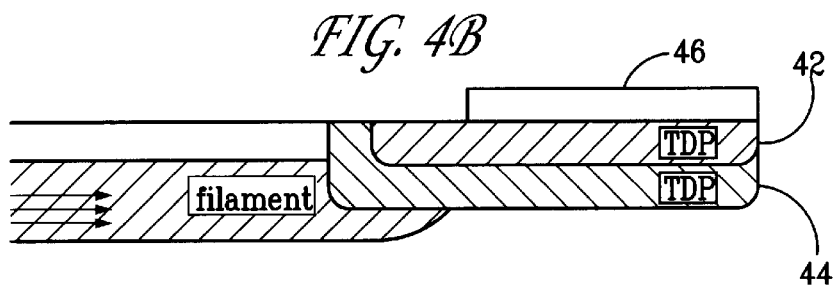
FIG. 4B

HIGH GAIN PHOTOCONDUCTIVE SEMICONDUCTOR SWITCH HAVING TAILORED DOPING PROFILE ZONES

STATEMENT REGARDING FEDERALLY SPONSORED RESEARCH

This invention was made with Government support under Contract DE-AC04-94AL85000 awarded by the U.S. Department of Energy. The Government has certain rights in the invention.

BACKGROUND OF THE INVENTION

This invention relates to photoconductive semiconductor switches. Photoconductive semiconductor switches (PCSS) are under investigation for use as short duration, high current semiconductor devices. A PCSS in the lateral configuration is shown in FIG. 1A. More particularly, this invention relates to such switches implemented in gallium arsenide that have electric fields in excess of the lock-on voltage impressed across their terminals at the time laser light is directed upon them to trigger the mobilization of the charge carriers in the switch.

PCSS based on the lock-on effect have previously been fabricated in GaAs. The switches discussed herein are GaAs switches laid out in a lateral or vertical configuration as shown in FIGS. 1A and 1B respectively. At electric fields below about 4 kV/cm, GaAs switches are activated by the creation of, at most, one electron hole pair per photon absorbed. This linear mode demands high laser power, and, after the laser light is extinguished, the carrier density decays exponentially in 1–10 ns. At higher electric fields these switches behave very differently. On triggering, the high field induces carrier multiplication so that the amount of light required is reduced by as much as five orders of magnitude. We have used trigger energies as low as 180 nJ to deliver 48 MW in a 30–50 ohm system and as low as 2 nJ from a vertical cavity surface emitting laser (VCSEL). In the 'on' state the field across the switch stabilizes to a constant called the lock-on field. The switch current is circuit-limited provided the circuit maintains the lock-on field. As the initial (prior to triggering) field increases, the switch risetime decreases and the trigger energy is reduced. During high gain switching the switches emit bandgap radiation due to carrier recombination. When this radiation is imaged, filaments are observed, even if the triggering radiation is uniform. The filaments can have densities of MA/cm$^2$ and diameters of 15–300 $\mu$m.

These switches can be used for pulsed power applications as diverse as low impedance, high current pulsers and high impedance, low current Pockels cell or Q switch drivers. Advances in this technology offer improvements over alternative switching schemes, i.e. 100 ps risetime, kilohertz (continuous) and megahertz (burst) repetition rates; they are scalable or stackable to hundreds of kilovolts and tens of kiloamps, useful for optical control and isolation, and have inherent solid state reliability.

However, existing PCSS switches are limited to use in applications where the switches are to be used for a limited number of pulses. The current filamentation causes damage to the switch at the point where the current enters or exits the insulating, un-doped, region of the switch (the intrinsic region). What is needed is an improved GaAs PCSS with higher longevity.

High current density in the PCSS leads to localized heating during operation and consequent reliability problems. Although PCSS have been demonstrated to operate at currents in excess of 1000 amperes and switch voltages in excess of 100 kV, no practical devices have demonstrated sufficient reliability to be used in a real application. Depending on the operating current level and the type of charging circuit used, the switch life has not exceeded 2×10$^5$ pulses for a standard test condition with a pin structure and strong light trigger. The next section will address different triggering methods. Current levels in excess of 20 A do not even achieve this lifetime, with the life dropping dramatically as the current is increased. For example, a 1000 A current level has been achieved for only 2 pulses. When the switch degrades, the damage is observed primarily at one or both of the metal contacts.

A number of approaches to alleviate the damage to PCSS while maintaining its high current and short pulse duration have been attempted. It has been shown that diffuse triggering near a given contact leads to multiple filaments near that contact. Instead of triggering the filament with a single localized pulse of light, the trigger light is spatially spread out over a larger area adjacent to the contact. When the filament is initiated, the filament image consists of multiple filaments near the source of the triggering light. By the use of this technique, the damage near the contact of the diffuse triggered region is greatly lessened. For example, in a lateral PCSS with a p-type ohmic contact for the anode and an n-type contact for the cathode, the p-type contact erodes first with conventional localized triggering. However, a diffused light trigger near the p-contact results in multiple filaments near the p-contact and results in a dramatic increase in the useful life of the PCSS prior to the onset of damage. Great improvements in longevity were obtained at about 10 A, where millions of switching actions were obtained with no damage. When damage is observed, the n-type contact is more heavily damaged. The use of dual optical fibers to diffusely trigger both sides of the PCSS has proven beneficial, but still does not lead to sufficiently long operation of the PCSS at useful current levels. For example, when switching a voltage of 9,000 Volts, discharging a current of 70 A for 3.5 ns, a diffuse-triggered PCSS only lasted 650,000 pulses and had considerable damage.

Ion implantation or diffusion has also been suggested as a method of reducing the current crowding (or current pinching or increasing the transfer length) at the edge of the contact to increase PCSS lifetime. However, neither method specifically articulated any detail other than that noted above.

Significant effort has addressed the longevity problem by improving the quality of the contacts. Quite a number of different metal contacts have been attempted, including: ohmic contacts with thick Au for better heat conduction, refractory metals such as tungsten, and variations of the ohmic metal recipe. However, the current densities in a PCSS are so high that there is no example of metals in other semiconductor technologies that will withstand these current densities.

There is an unmet need in the art for a PCSS that can survive many cycles at elevated current levels without significant damage.

SUMMARY OF THE INVENTION

The introduction of tailored doping profile (TDP) zones in the regions of the PCSS beneath and about the contacts produces a higher performance PCSS that will operate successfully in high current, high repetition applications. A semiconductor region that surrounds at least the edge of the contact is selectively doped to a depth and lateral extent such that the energy density of the PCSS filament is reduced as the current is collected at the contact. The current filament in PCSS is tens to hundreds of microns in diameter and both lateral and vertical tailoring of the doping profile is desirable. The goal is to reduce the energy density at the contact by both 1) removing energetic events from the proximity of the contact as much as possible through a reduction of the electric field near the contact so as to suppress collective impact ionization and consequent filament formation and by 2) reducing the current density at the contact through enhanced current spreading. The former is achieved by tailoring the lateral doping profile (in the direction of current flow) and the latter is achieved by tailoring the lateral and vertical (into the substrate) doping profiles. The tailored doping profile is fabricated in such a way so as not to degrade other desirable aspects of the PCSS such as high standoff voltage, resistance to surface flashover, ability to be triggered optically, and the like.

BRIEF DESCRIPTION OF THE SEVERAL VIEWS OF THE DRAWING

FIG. 3a is a vertical view schematic of a prior art PCSS showing a current filament directly affecting an electrical contact.

FIG. 3b is a vertical view schematic of a PCSS with a TDP zone that separates the contact from the end of the current filament.

FIG. 4a is a cross section schematic of a prior art PCSS showing the vertical concentration of the current filament into the edge of the contact.

FIG. 4b is a cross section schematic of a PCSS with a TDP zone that vertically spreads the current between the end of a current filament and the contact.

DETAILED DESCRIPTION OF THE INVENTION

Figure 1A:
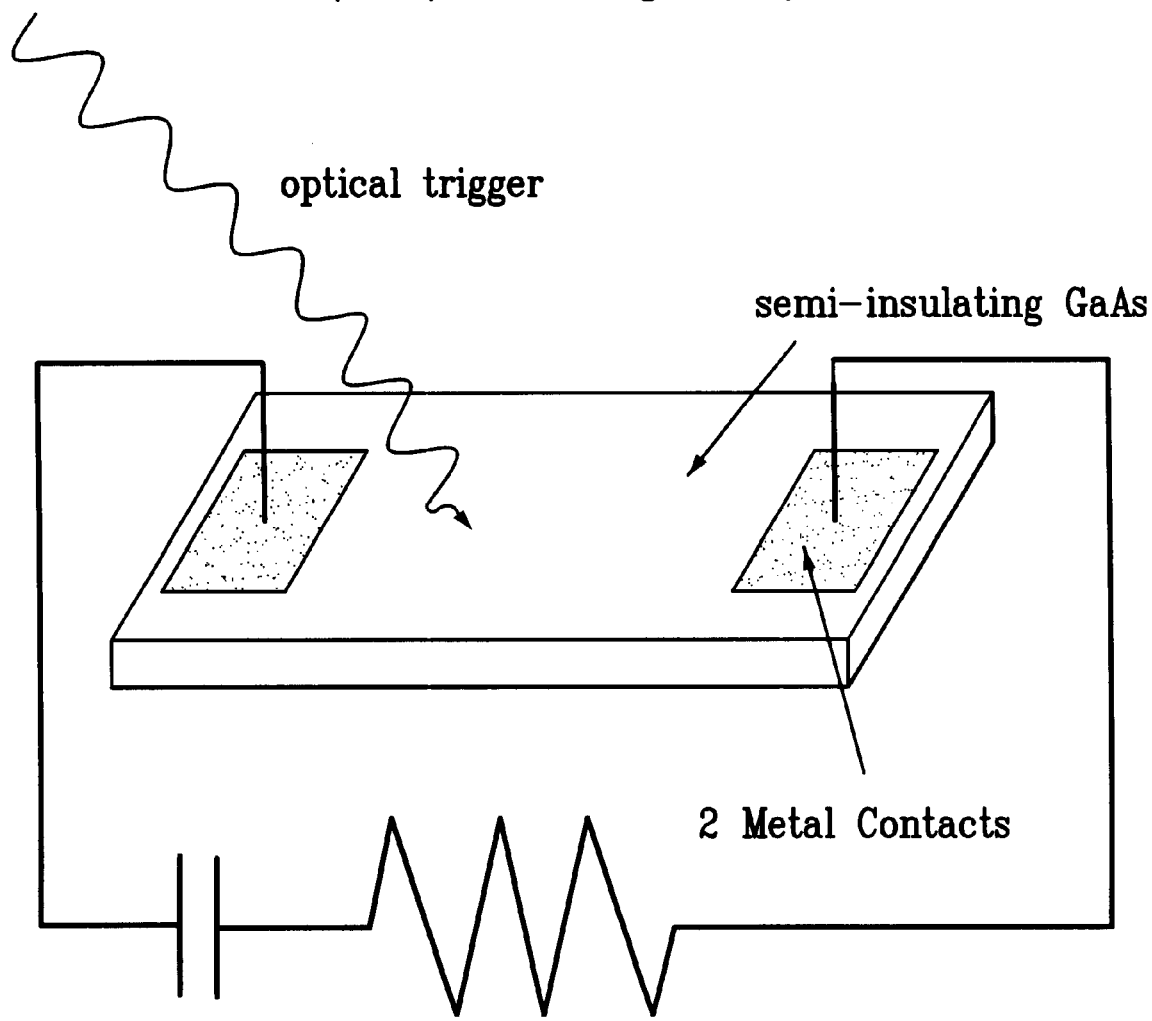
FIG. 1a is a schematic diagram of a prior art lateral PCSS.
Figure 1B:
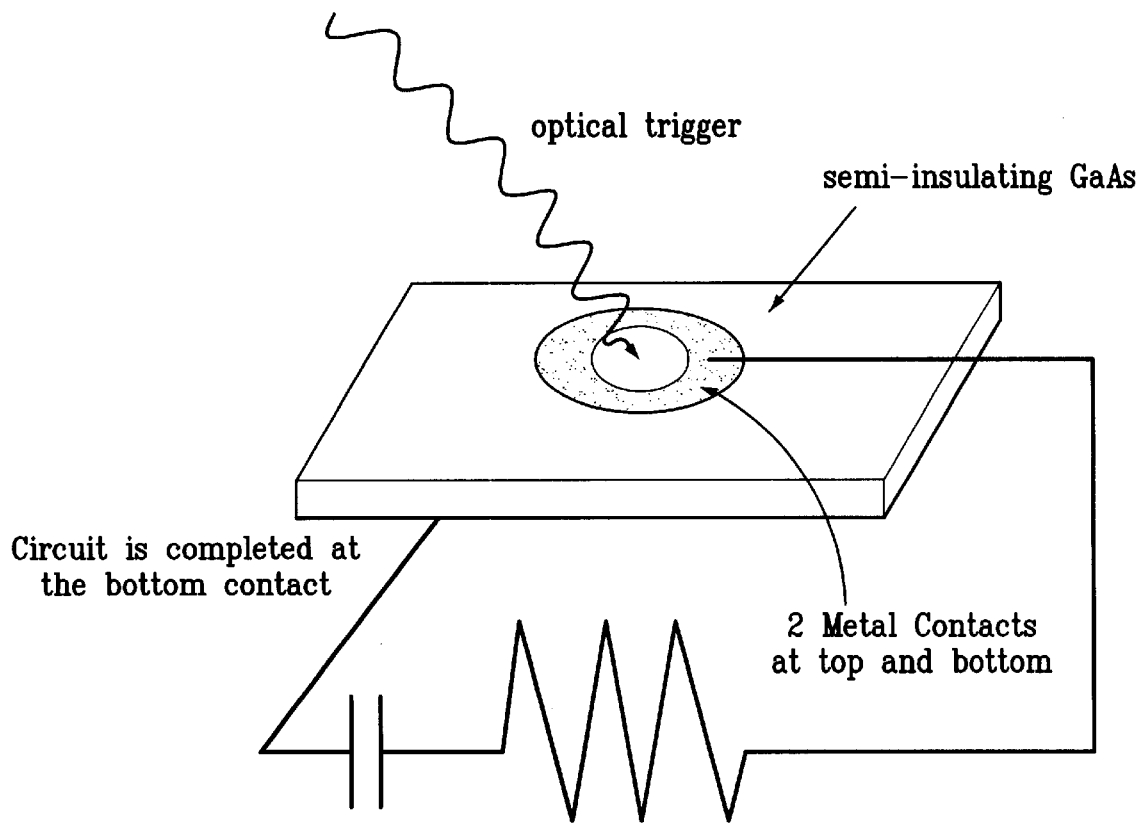
FIG. 1b is a schematic diagram of a prior art vertical PCSS.
Figure 2A:
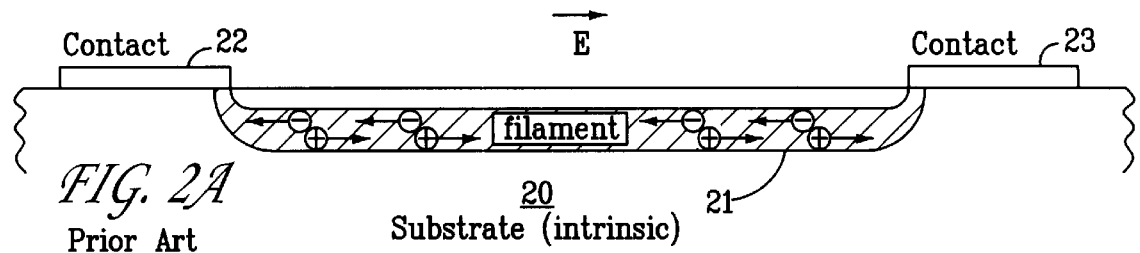
FIGS. 2a, 2b, 2c, and 2d are cross section diagrams of a prior art PCSS, a PCSS with TDP zones formed in the substrate, a PCSS with TDP zones formed above the substrate and a PCSS with TDP zones formed in etched wells in the substrate, respectively.

In FIG. 2a, a conventional PCSS cross-section is schematically illustrated. In the intrinsic channel region 20 there is a high current density filament 21 that is responsible for the current conduction. There is also a high electric field, and the PCSS device is continuously extracting energy from the applied electric field. Both electrons and holes are accelerating in response to the applied field and creating new carriers by a mechanism termed collective impact ionization. This newly discovered mechanism becomes dominant at carrier densities sufficiently high that carrier-carrier scattering is faster than carrier-phonon scattering. In this high density regime, carrier-carrier scattering redistributes the energy gained from the electric field leading to a carrier distribution function which approaches quasi-equilibrium. Thus, an electric field, the lock-on field, is able to sustain a stable filament by impact ionization. Collective impact ionization differs from conventional impact ionization in that a larger fraction of electrons have reached high energies and are thus able to generate additional electrons and holes by impact ionization. As a result, the lock-on electric field (approximately 5 kV/cm) is much smaller than the electric field (several kV/cm) required to initiate conventional impact ionization. The high field region is adjacent to both contacts 22, 23 and energetic electrons or holes that enter the contact can deposit significant amounts of energy in that region and damage to the contacts will result.

Figure 2B:
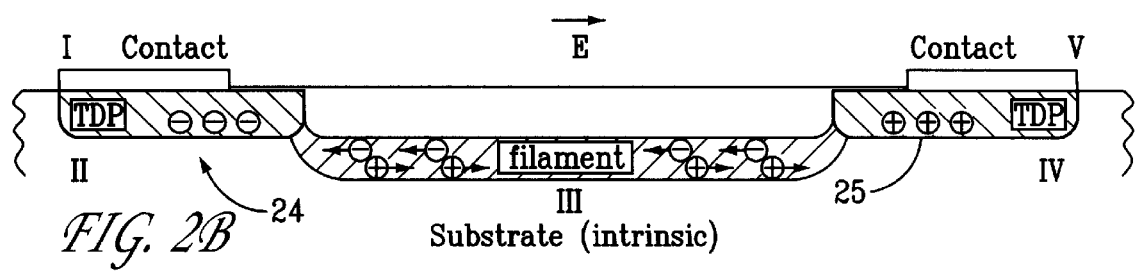
Figure 2C:
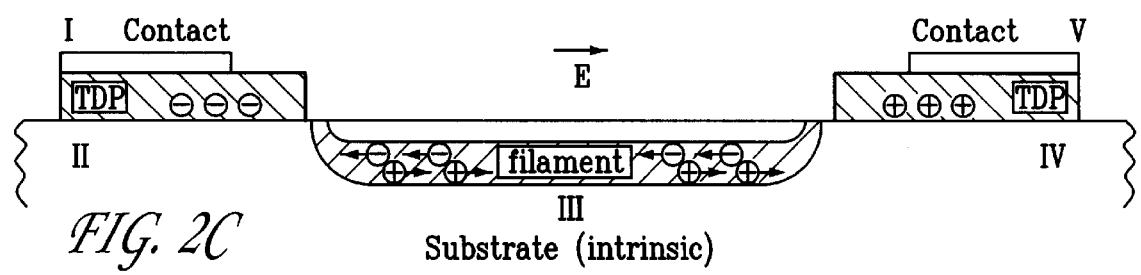
Figure 2D:
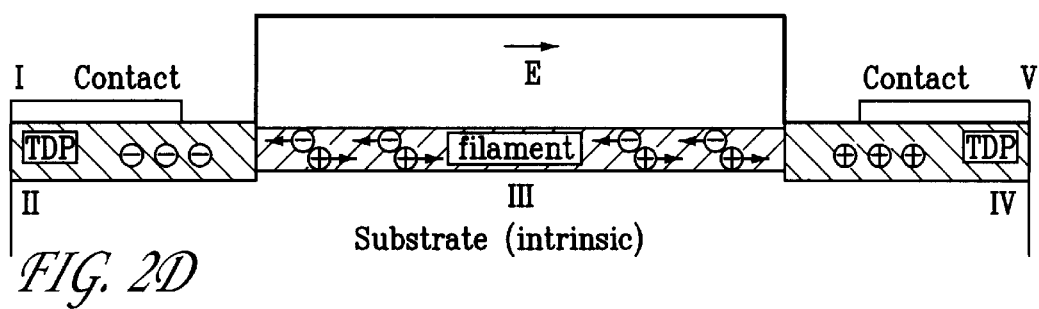

By separating the filaments in the channel from the contacts with the TDP zones, one can reduce the high electric field region near the contacts. FIG. 2b shows a schematic cross section of a PCSS with TDP zones 24, 25. In a TDP zone, the doping profile of the zone is designed such that a lower electric field results, thus collective impact ionization no longer occurs in the TDP and the device is now extracting much less energy from the field in the region of the metal contact which previously sustained most of the damage. Current conduction into the contact occurs as follows for the case of electrons (holes have an analogous conduction with opposite charge polarity). Referring to FIG. 2b, an energetic electron from the filament at the edge of region III enters the TDP region 25 in response to the electric field. Region 25 contains a large electron density from the electron donor dopants. For each energetic electron that enters region 25, the current into contact V is supplied by less energetic electrons from ionized donors that are in proximity to the contact. Current flows by small displacements of large numbers of electrons. The energetic electron gradually dissipates some of its energy far away from contact V and energy dissipation is not as high near the contact as in the conventional case. The TDP region serves the purpose of separating the energy dissipation at the edge of the filament from the contact. FIGS. 2c and 2d illustrate other conceptions of a TDP region where the TDP regions are elevated from the substrate for a non-planar implementation of the concept.

Apart from separating high energy density regions of the channel in the PCSS from the contact, this invention improves longevity by promoting current spreading. As shown in a top view of FIG. 3a, a current filament in the intrinsic region would reach the contact with a diameter determined by collective impact ionization. With a TDP region 34 as in FIG. 3b, the filament 32 is no longer sustained, and the charges can spread by coulomb interactions. The current density into the contact 35 is then reduced, and greater lifetime of the PCSS is expected.

This invention also promotes current spreading in the vertical dimension compared to a conventional PCSS. In FIG. 4a, the current of a conventional PCSS filament meets the contact. Because of the greater conductivity of the metal than the semiconductor, the electrons near the top of the filament enter the contact with greater ease than those deeper into the semiconductor. For this region most of the current flows into the contact near the edge 40 of the contact. The cross-sectional area of current entry can be less than the cross-sectional area of the filament. This current crowding results in high damage to the contacts. In FIG. 4b, a cross section is illustrated where the TDP is shown with two regions 42 and 44. By making region 44 of the TDP more conductive, current can be induced to spread away from the edge of the contact 46.

In the past, researchers have been concerned by current crowding (sometimes termed pinching or reduced transfer length) into the contact. In the prior art of PCSS, ion implantation or diffusion was suggested as a solution to the current crowding problem without any significant detail. No mention of lateral current spreading was made in the references. Also, neither ion implantation or diffusion as taught in the prior art can create the doping profile of FIG. 4b and thus can only partially alleviate current crowding. The present invention actually induces current spreading in both lateral (as in FIG. 3b) and vertical (FIG. 4b) dimensions.

Figure 5:
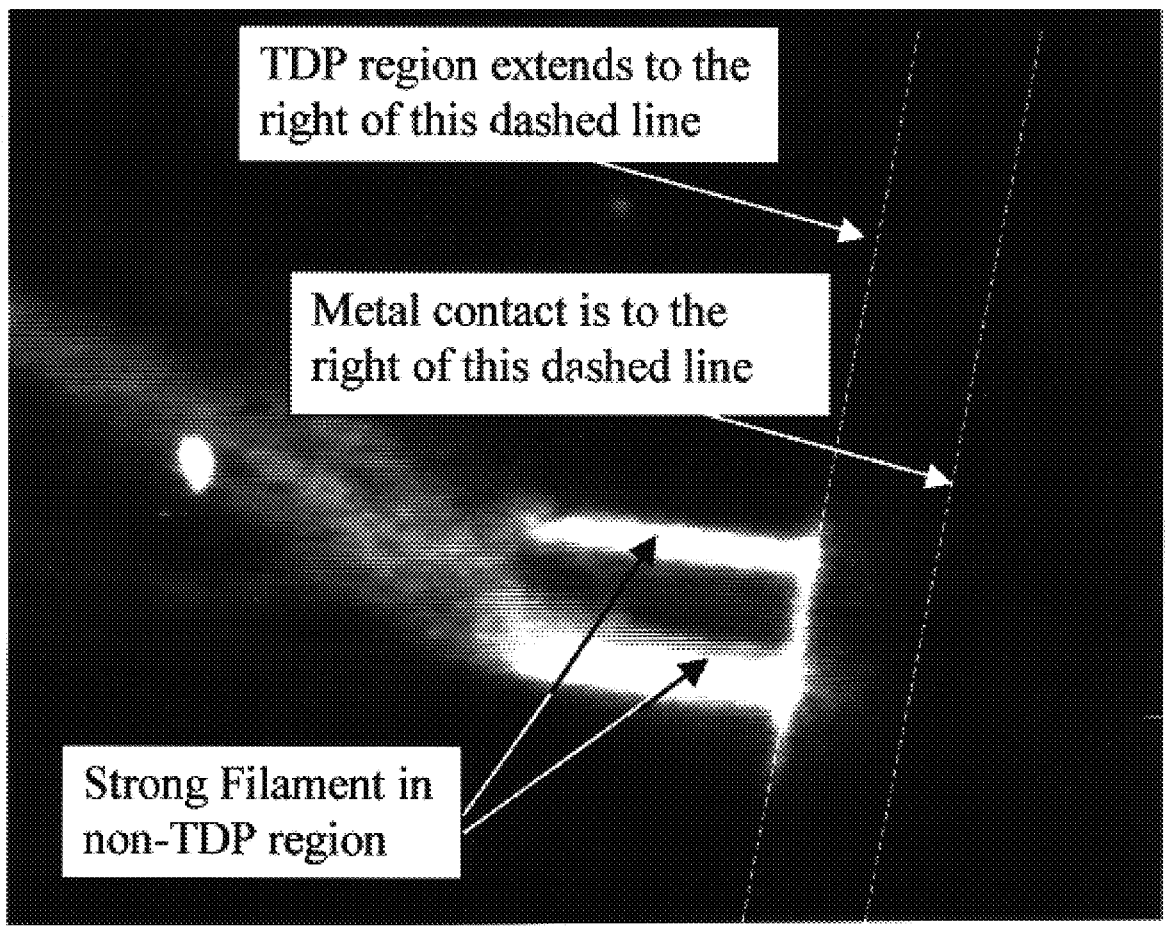
FIG. 5 is a microphotograph that is annotated to show failure of a current filament to propagate through a TDP zone.

Experimental evidence indicates that the TDP suppresses filament formation and contact damage. Light emission images from selectively doped regions formed by diffusion show strong emission from the filaments that are generated in the intrinsic region, but no detectable emission from the selectively doped regions for currents below 60 amperes. As shown in FIG. 5, the filament stops at the edge of the doped region, well away from the contact, and no damage is observed. This current level is the highest yet attained without damage by any previous devices. At currents of 60 amperes, the filament reappears and damage is observed at the contact within 200,000 pulses. We postulate that the free charge density in the filament exceeds that of the TDP region and the electric field in the region increases to the point of sustaining collective impact ionization. A solution is to redesign the TDP region to support larger currents, according to the needs of the application.

Method of Epitaxial Fabrication

Figure 6:
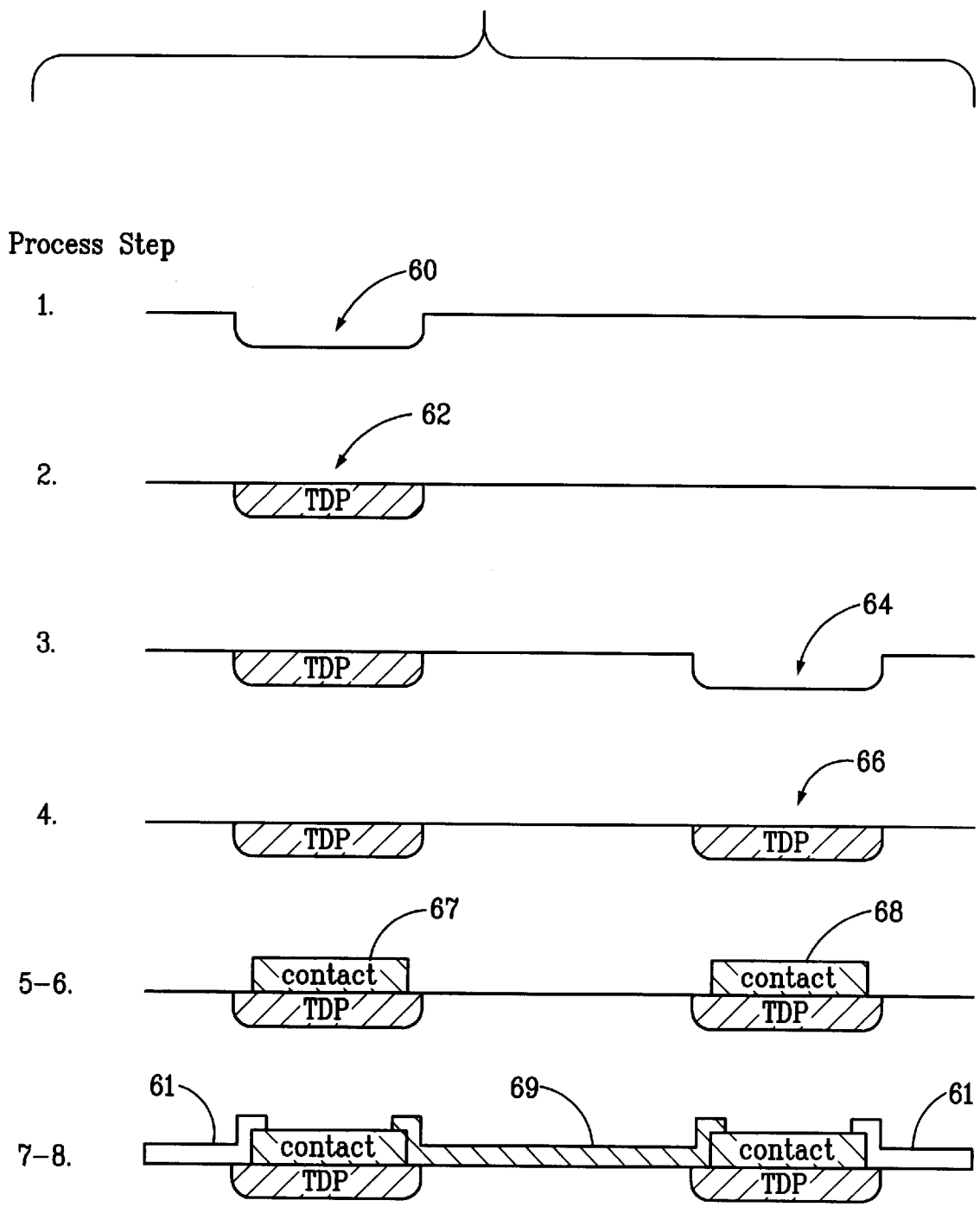
FIG. 6 shows a sequence cross sectional views representing the process steps used to form a PCSS with TDP zones formed in depressions in the substrate by epitaxial deposition.

An outline of the method for epitaxial growth is shown in FIG. 6. The first step consists of depositing a suitable mask that does not support growth of substrate material, then subsequently patterning a region for a TDP for a first contact followed by removing substrate material through an opening in the mask up to a depth 60 sufficient to match the filament of interest and then removing the pattern material. The second step consists of preparing the surface for a high quality substrate growth step and then performing the regrowth of the TDP region 62 by epitaxial deposition and then removing the mask and any impurities deposited on the mask. The third step consists of depositing a suitable mask that does not support growth of substrate material, then subsequently patterning a region for a TDP for a second contact followed by removing substrate material up to a depth 64 sufficient to match the filament of interest and them removing the pattern material. The fourth step consists of preparing the surface for a high quality substrate regrowth step and then performing the regrowth of the TDP region 66 by epitaxy and then removing the mask and any impurities deposited on the mask. The fifth and sixth steps consist of patterning and depositing a first contact metal 67 and then removing the pattern material and then patterning and depositing a second contact metal 68 and then removing the pattern material. The seventh step consists of patterning and depositing a bond pad metal 61 and then removing the pattern material. The eighth step consists of depositing a passivation material 69, patterning and removing passivation material in the areas desired and then removing the pattern material.

The actual epitaxial depositions may be done as follows. For the TDP zone for the anode contact, a p-layer growth is performed in an Emcore GS3200 rotating disk MOCVD reactor at a temperature of 620 degrees C. with a flow mixture of trimethyl gallium, arsine and dimethyl zinc to achieve a doping level of $3\times10^{19}/cm^3$. For a 1 micrometer regrowth a growth time of 16.67 minutes is used. For the TDP zone beneath the cathode, an n-layer growth is performed on the same machine at a temperature of 610 degrees C. with a flow mixture of trimethyl gallium, arsine and disilane to achieve a doping level of $4\times10^{19}/cm^3$. For a 1 micrometer regrowth a growth time of 16.67 minutes is used.

Method of Other Tailored Doping Fabrication

Figure 7:
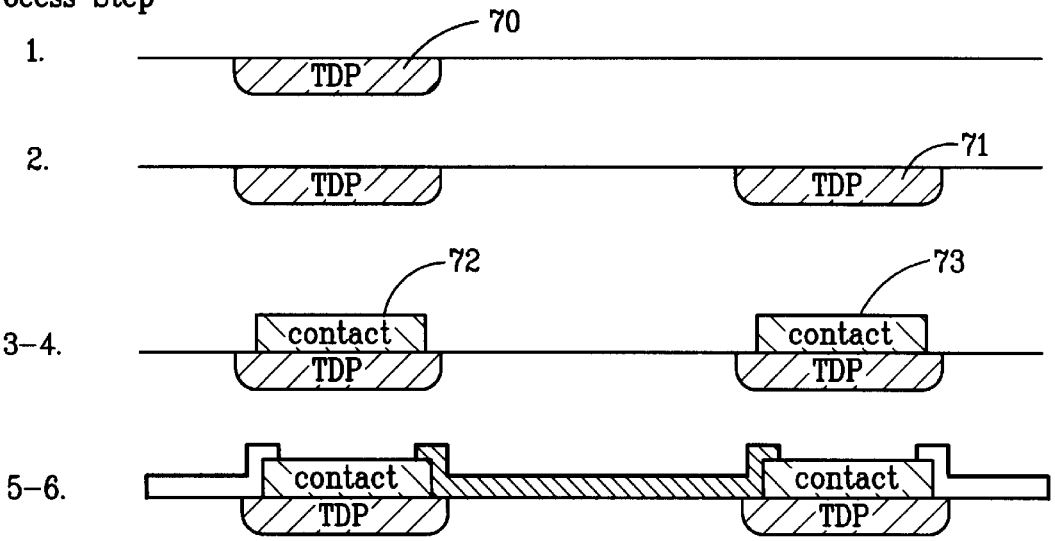
FIG. 7 shows a sequence cross sectional views representing the process steps used to form a PCSS with TDP zones formed in the substrate by diffusion.

An outline of the method for other tailored doping is shown in FIG. 7. The first step consists of depositing and patterning a suitable mask that does not allow penetration of the tailored dopant, then subsequently introducing the first tailored dopant associated with the first contact region through an opening in the mask to form the TDP zone 70 and then removing the mask. The second step consists of depositing and patterning a suitable mask that does not allow penetration of the tailored dopant, then subsequently introducing the second tailored dopant associated with the second contact region through an opening in the mask to form the TDP zone 71 and then removing the mask. The third and fourth steps consist of patterning and depositing a first contact metal 72 and then removing the pattern material and then patterning and depositing a second contact metal 73 and then removing the pattern material. The fifth step consists of patterning and depositing a bond pad metal and then removing the pattern material. The sixth step consists of depositing a passivation material, patterning and removing passivation material in the areas desired and then removing the pattern material.

Figure 8:
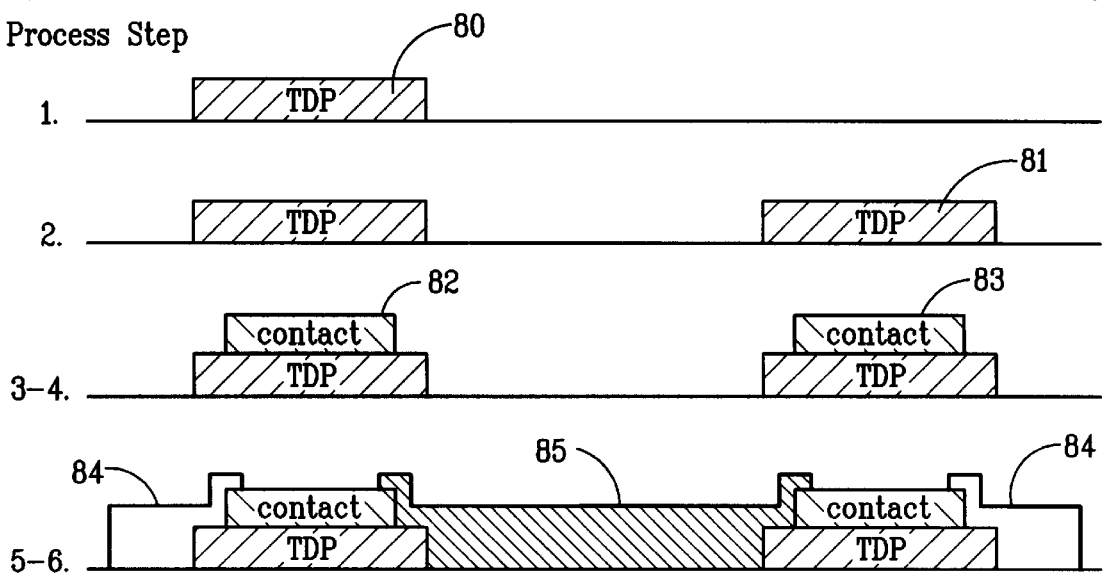
FIG. 8 shows a sequence of cross sectional views representing the process steps used to form a PCSS with TDP zones formed on top of the substrate with subsequent deposition of contacts, bond pad material and passivation material.

Another method for implementing this invention is illustrated in FIG. 8 for the non-planar device of FIG. 2c. The first step consists of a first epitaxial growth of a TDP layer(s) 80 followed by a patterning and etching of the first growth back to the substrate and then removing the mask. The second step consists of a second epitaxial growth of a second TDP region 81, preferably beginning with an etch stop layer followed by the TDP layer(s) and patterning and etching of the second TDP region and then removing the mask. The third and fourth steps consist of patterning and depositing a first contact metal 82 and then removing the pattern material and then patterning and depositing a second contact metal 83 and then removing the pattern material. The fifth step consists of patterning and depositing a bond pad metal 84 and then removing the pattern material. The sixth step consists of depositing a passivation material 85, patterning and removing passivation material in the areas desired and then removing the pattern material, PCSS devices have been fabricated with both diffusion and epitaxial overgrowth. Diffusion has been used with the p-contact region only and with both the p- and n-contact regions. Diffusion depths between 1 and 4 $\mu$m have been evaluated. Epitaxial overgrowth has been demonstrated for the p-region only with the overgrowth region etched back 1.5 $\mu$m and then filled in. In all cases it has been verified that luminescence for the filament is present only in the intrinsic region of the PCSS. Ion implantation has also been evaluated. The ion implantation technique is less suitable for tailored doping profiles than diffusion or epitaxial overgrowth due to the difficulty of simultaneously achieving high doping levels and deep implantation to match the filament dimension. The ion implanted PCSS was successful in reducing the intensity of the filament in the TDP region but not in totally suppressing it. Future advances in the technique may make it suitable for producing more effective tailored doping profile zones.

As discussed above, ion implantation and diffusion have been previously suggested as a solution to the lifetime problem by lessening current crowding. Both techniques are examples of tailored doping profiles. However an optimum design for reducing current crowding would not effectively remove the energetic electrons of the filament sufficiently from the contact. For example, in FIG. 2b, a TDP with depth equal to the lateral distance from the edge of the contact would effectively lessen current crowding. However, much greater lateral distances are required to eliminate damage from the contacts. Contacts with a TDP lateral extent of 100 $\mu$m and a vertical extent of 1–4 $\mu$m were fabricated. These contacts were able to suppress contact damage up to 60 amperes with a much greater lateral extent than vertical. This result would not be apparent to one designing the TPD for solely for suppression of current crowding.

It will be apparent to those with skill in the art that other variations and further embodiments of the invention are possible beyond those described above. The true scope of the invention is to be found in the appended claims.

What is claimed is:

1. A photoconductive semiconductor switch comprising positive and negative electrical contacts located on a semiconductor substrate with the contacts being separated by an intrinsic channel region wherein the contacts are protected from the destructive effects of high current filaments in the channel by respective tailored doping profile zones that separate the contacts from the channel.

2. The switch of claim 1 wherein the zones extend laterally from the edges of the contacts towards the channel and extend into the substrate beneath the contacts.

3. The switch of claim 1 wherein at least one of the zones comprises epitaxial material regrown on the substrate beneath the contacts.

4. The switch of claim 3 wherein the regrowth is in depressions in the surface of the substrate.

5. The switch of claim 3 wherein the regrowth is on the surface of the substrate.

6. The switch of claim 1 wherein the zones comprise a first region of the substrate beneath the positive contact containing a p-dopant and a second region of the substrate beneath the negative contact containing an n-dopant, the vertical profiles of the dopants in the first and second regions extending at least to a depth sufficient to capture a majority of the cross section of a current filament in the channel.

7. A method of forming a photoconductive semiconductor switch comprising:

forming a first tailored doping profile zone of a first conductivity type in the upper surface of a semiconductor substrate;

forming a second tailored doping profile zone of a second conductivity type in the upper surface of the semiconductor substrate, the two zones being separated by a channel region of intrinsic semiconductor material;

forming first and second electrical contacts atop the first and second tailored doping profile zones respectively, such that the depth of the zones is sufficient to capture at least 10% of the cross section of a current filament in the channel and the lateral extent of the zones beyond the perimeter of the contacts is sufficient to protect the electrical contacts from destructive effects of high current filaments in the channel; and forming bond pad metal atop the first and second contacts.

8. The method of claim 7 wherein at least one of the zones is formed by removing substrate material from the upper surface of the substrate to form a depression in which epitaxial material of the appropriate conductivity type is regrown to form the at least one tailored doping profile zone.

9. The method of claim 8 wherein both zones are formed in the same manner, with one being of the first conductivity type and the other being of the second conductivity type.

10. The method of claim 7 wherein at least one of the zones is formed by diffusing a dopant of a first conductivity type into one of the zones.

11. The method of claim 7 wherein the other zone is formed by diffusing a dopant of a second conductivity type into the other zone.

12. The method of claim 7 wherein at least one of the zones is formed by introducing a dopant of a first conductivity type by ion implantation.

13. A method of forming a photoconductive semiconductor switch comprising:

forming a first tailored doping profile zone of a first conductivity type at the upper surface of a semiconductor substrate;

forming a second tailored doping profile zone of a second conductivity type at the upper surface of the semiconductor substrate, the two zones being separated by a channel region of intrinsic semiconductor material;

forming first and second electrical contacts atop the first and second tailored doping profile zones respectively, such that the depth of the zones and the lateral extent of the zones beyond the perimeter of the contacts are sufficient to protect the electrical contacts from destructive effects of high current filaments in the channel; and forming bond pad metal atop the first and second contacts.

14. The method of claim 13 wherein at least one of the zones is formed by epitaxial deposition of a doped semiconductor material onto the upper surface of the substrate.

15. The method of claim 14 wherein both zones are formed by epitaxial deposition of respective first and second conductivity type doped semiconductor materials onto the upper surface of the substrate.

16. The method of claim 14 wherein the other of the two zones is formed by diffusion of a dopant of a second conductivity type into the upper surface of the substrate.

* * * * *